Figure 1:
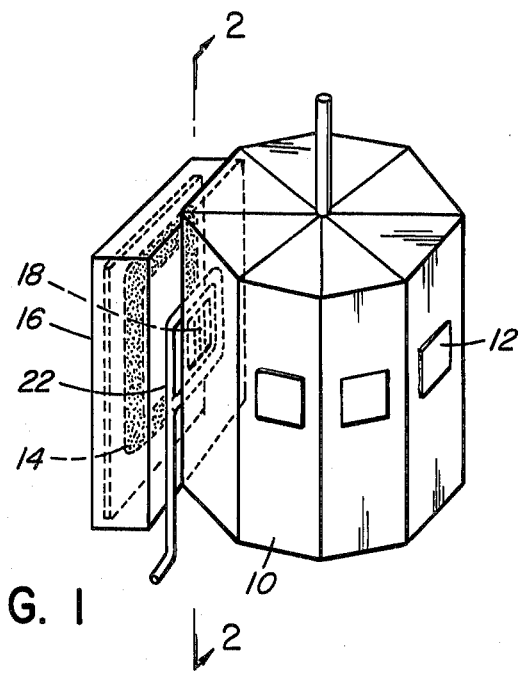

United States Patent [19]

Maniv et al.

[11] 4,392,931
[45] Jul. 12, 1983

[54] REACTIVE DEPOSITION METHOD AND APPARATUS

[75] Inventors: Shmuel Maniv; William D. Westwood, both of Nepean, Canada

[73] Assignee: Northern Telecom Limited, Montreal, Canada

[21] Appl. No.: 249,402

[22] Filed: Mar. 31, 1981

[51] Int. Cl.³ .......................................... C23C 15/00
[52] U.S. Cl. ........................... 204/192 R; 204/192 S; 204/192 P; 204/298
[58] Field of Search ............... 204/192, 192 R, 192 P, 204/298

[56] References Cited

U.S. PATENT DOCUMENTS

| | | | |
|---|---|---|---|
| 3,400,066 | 9/1968 | Caswell et al. | 204/192 EC |
| 3,716,472 | 2/1973 | Kausche | 204/298 |
| 3,749,658 | 7/1973 | Vossen | 204/192 P |
| 3,904,503 | 9/1975 | Hanfmann | 204/192 R |
| 3,976,555 | 8/1976 | Von Hartel | 204/192 P |
| 4,128,466 | 12/1978 | Harding et al. | 204/192 P |
| 4,134,817 | 1/1979 | Bourdon | 204/298 |
| 4,180,450 | 12/1979 | Morrison | 204/192 R |
| 4,198,283 | 4/1980 | Class et al. | 204/192 R |
| 4,298,444 | 11/1981 | Chahroudi | 204/192 P |

FOREIGN PATENT DOCUMENTS

| | | | |
|---|---|---|---|
| 681287 | 3/1964 | Canada | 204/192 P |
| 315723 | 12/1969 | U.S.S.R. | 204/298 |

*Primary Examiner*—Veronica O'Keefe
*Attorney, Agent, or Firm*—Stuart L. Wilkinson

[57] ABSTRACT

Using a sputter deposition system to reactively deposit a material such as an oxide, it is relatively easy to achieve either an oxygen-doped film with appreciable metallic content or an oxide film. However it is difficult with known systems to obtain an intermediate film having an accurately controlled resistivity, transparency, and composition, such films being of much use in semiconductor applications, in displays and in photovoltaic cells. It is now proposed that an apertured barrier be used to accurately fix the flow rate of target material to the substrate and in addition, that reactive gas flow be regulated and directed only to the immediate vicinity of the substrate. In this way the composition of the film can be accurately fixed. By establishing an r.f. field at the substrate, increased dissociation of the reactive gas can be achieved to render the gas more reactive and so enhance certain film properties such as transparency.

11 Claims, 2 Drawing Figures

U.S. Patent  Jul. 12, 1983  4,392,931

REACTIVE DEPOSITION METHOD AND APPARATUS

This invention relates generally to deposition of thin films and is particularly concerned with the sputter deposition of films which are both transparent and semi-conducting.

Sputtering takes place as a result of the removal of atomic or molecular material from a target or cathode caused by bombardment of the target with positive gas ions. In non-reactive sputtering, the target material and the sputter deposited material are chemically similar whereas in reactive sputtering they are different. In the latter, target material at the target itself, or during its passage to the substrate, or as it is incident on the substrate, reacts with a gas introduced into the sputtering reaction chamber. For example, an alumina coating can be sputter deposited from an aluminum target by maintaining the substrate in an oxygen atmosphere. An advantage of reactive sputtering is that the sputtering rate from a metallic target is frequently faster than the sputtering rate from a target consisting of a compound of the reactive materials. This is certainly true of many oxides.

Known reactive sputter depositing methods for oxides have either produced oxide films which are normally highly resistive and transparent or have produced oxygen doped films with appreciable metallic content which are normally conductive and relatively opaque. In the fabrication of displays, photovoltaic cells, photoreceptors, solar reflectors, and solar cells there is a need to deposit semiconductors and transparent conducting films.

From investigations of the oxidation kinetics of metallic targets sputtered in inert gas/oxygen mixtures, a sharp transition from oxygen doped metallic film to oxide film is seen to occur with minimal change in deposition conditions. Consequently in known sputtering methods, either deposition conditions are held below the transition, films obtained then being semiconducting but opaque, or are above the transition in which case sputtering is slow and films obtained are transparent but resistive. In neither case is the film obtained adapted for use in the products mentioned above.

A sputtering system is now proposed by means of which the sputtering conditions can be maintained at the transition position referred to. In this way, the composition of a reactively sputtered film can be selected to produce desired physical characteristics. In particular, the oxygen vacancy density in oxide films is controlled to optimize conductivity and transparency of the films.

According to the invention there is provided sputter deposition apparatus for reactively depositing a thin film, the apparatus comprising a substrate, a target, means for directing a stream of atomic or molecular target material from the target to the substrate, means for directing a flow of reactive gas at a preset flow rate to the substrate, and means for accurately controlling the rate at which target material reaches the substrate whereby, at said preset reactive gas flow rate, to accurately determine the composition of a film reactively deposited from the target material and the reactive gas.

The particles can be produced from a target in, for example, a high rate triode or magetron sputtering system.

Preferably the means for controlling the particle rate comprises a barrier having an apertured region therein. The apertures in the barrier can, for example, comprise a group of parallel slits extending in one direction. The substrate can be mounted on a slowly rotating carousel having an axis of rotation parallel to said direction. The barrier means can comprise a box around the target to limit passage of reactive gas to the target. The reactive gas is preferably directed onto the substrate from a tube extending around a deposition area of the substrate, the tube having holes therein through which the gas escapes in the direction of the deposition area.

In order to increase the reactivity of the gas, gas molecules can be caused to dissociate by subjecting the substrate to r.f. energization.

Figure 2:
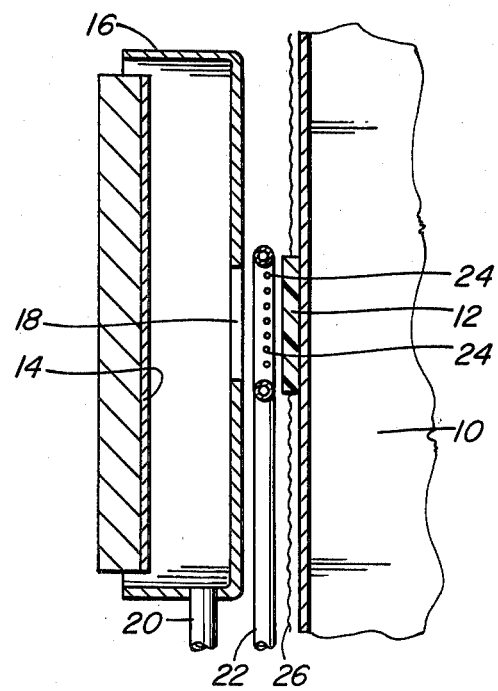

Embodiments of the invention will now be described by way of example with reference to the accompanying drawings in which:

FIG. 1 is a perspective view of interior components of sputter deposition apparatus according to the invention; and FIG. 2 shows the interior components of FIG. 1 in vertical section.

Referring in detail to FIGS. 1 and 2, components of the apparatus shown are understood to be located in the interior of a stainless steel sputter deposition chamber. On a vertical axis of rotation is mounted an octahedral carousel 10 on each face of which is mounted a substrate 12. Spaced from the carousel and facing it is a target 14. As is well known in magnetron sputter deposition systems, but not shown here, through the wall of the chamber extend electrical leads, gas conduits, and monitoring and control lines. The leads permit both application of a dc sputtering voltage of the order of 450 volts to the target and operation of a magnetic field of the order of 500 gauss in the vicinity of the target. The gas conduits permit delivery to the chamber both of an inert gas for the sputtering system and a reactive gas to combine with material sputtered from the target. The monitor and control lines are needed to ensure stable conditions within the sputter deposition chamber. As is standard practice in magnetron sputtering, negative voltage is applied to the target and an anode adjacent the target is made positive to promote sputter discharge of target material towards the substrate, such discharge being enhanced by the magnetic field. A shield behind the target prevents undesirable discharge from the target mounting.

Referring again to FIGS. 1 and 2, the target and substrate are spaced about 10 cm apart and are separated by a barrier in the form of a stainless steel box 16 extending around the target, the box being electrically grounded. The front wall of the box has a series of vertical split apertures 18 which limit the rate at which sputtered material is transmitted to a deposition area on the substrate to a value depending directly on the aggregate width of the slits 18. The carousel is rotated slowly to ensure uniform deposition.

During sputtering, the target 14 is surrounded by an inert gas such as argon which is directed into the box 16 through a stainless steel conduit 20. A reactive gas is fed into the sputter deposition chamber through a stainless steel tube 22 which extends around the deposition area of the substrate. As shown in vertical section in FIG. 2, the tube 22 has tiny holes 24 through which the reactive gas escapes, the positions of the holes ensuring that the gas is directed onto the substrate 12. In an alternative embodiment (not shown) the holes 24 are replaced by a slot along the inside surface of the tube 22.

R.f. power is coupled through the carousel to the substrate to ensure an r.f. field adjacent the deposition area.

To sputter deposit a film on the substrate 12, a negative voltage of the order of 450 volts is applied to the target and a magnetic field of about 500 gauss is set up in the region of the target, sputtering voltage and magnetic field strength being selected to ensure a high sputtering rate. Argon is then introduced into the box 16 through tube 20 and reative gas is introduced into the tube 22, the flow rate of gas onto the substrate 12 being selected for the particular composition of film desired. The arrangement of slits 18 in the box front face limits the sputtered material reaching the deposition area of the substrate and consequently also regulates the composition of the film while simultaneously permitting the target 14 to be sputtered at a high rate. Maintaining a high sputter rate diminishes the chance of reactive gas reacting with the target material at the target surface. For example, if the reactive gas is oxygen, target oxidation causes a significant reduction in deposition rate and also changes the nature of the deposited film. The controlled rate at which sputtered material is incident at the substrate surface permits an accurate selection of reactive gas flow in order to accurately determine the composition of the film produced. For the films of greatest interest, semiconducting transparent films produced by the reaction of sputtered metal with reactive oxygen, care must be taken to introduce sufficient oxygen that the relatively opaque films characteristic of an appreciable metal content do not result. However, if the oxygen rate is too high then the target surface will be saturated and a slowly deposited pure oxide film which is highly resistive will result. As previously mentioned, the transition from a film having an appreciable metallic phase to a film of highly resistive oxide is a sharp one for many target materials and the arrangement described enables careful regulation of the rates at which oxygen and sputtered material reach the substrate deposition area so that a range of intermediate compositions can be rapidly deposited.

Transparencies of an oxide film prepared by this method can be markedly increased by subjecting the substrate 20 to r.f. energization during sputtering, a film transparency increase of the order of 5 having been achieved in this manner. Although r.f. energization of a substrate is a known technique for establishing a bias voltage at the substrate to improve surface quality of insulating films, films with which the present invention is primarily concerned are semiconducting films in which any bias voltage established will necessarily be rather small. In the case of these films, the primary effect of r.f. energization appears to be to cause dissociation of the oxygen molecules, the resulting atomic oxygen being more reactive. Using r.f. energization of the substrate permits room temperature deposition of films with a transparency which ordinarily could be achieved only by annealing at 300° C. or higher. Such annealing may be undesirable in a process where previously deposited films might be damaged by high temperature.

Three specific examples of a reactive sputtering process and details of the films obtained thereby are listed below:

| Target | $Cd_2 Sn$ alloy | Zn | $In_{91}Sn_9$ |
|---|---|---|---|
| Target assembly | Vac. Tec. System, Type C, Fleximag | | |
| Magnetic Field | 500 gauss | | |

-continued

| | | | |
|---|---|---|---|
| Target Substrate Spacing | 9.5 cm | | |
| Aperture size and shape | vertical slits of 17 cm length and 16 slits | | |
| Substrates | slit ratio = 3:1 | slit ratio 3:1 Corning 7059 soda lime Erie glass fused quartz | slit ratio 7:1 |
| Substrate rotation | | 1 RPM | |
| Deposition period | 5 Min. | 4 Min. | 5 Min. |
| Non-reactive gas pressure | 2.5mTorr | 3.6mTorr | 3.0mTorr |
| Reactive gas flow rate | 31.8cc/min oxygen | 25cc/min oxygen | 28.7cc/min oxygen |
| Total pressure | 4.2mTorr | 4.1mTorr | 3.9mTorr |
| Discharge Voltage | 455 volt | 500 volt | 410 volt |
| Discharge Current | 2.0amp | 2.75amp | 2.0amp |
| Substrate temperature | | 300° K. | |
| RF Power | 100watt | 150watt | 100watt |
| Self bias | | approx. 5V | |
| Film Thickness | 725Å | 2200Å | 270Å |
| Transparency | | 95% | |
| Resistivity | $4.4 \times 10^{-4}$ ohm cm | $3.7 \times 10^{-3}$ ohm cm | $1.0 \times 10^{-3}$ ohm cm |
| Resistance | 60 ohm/sq. | 170 ohm/sq. | 380 ohm/sq. |

Although the examples listed are concerned with oxides, it will be appreciated that other reactive gases such as $N_2$, $H_2S$, $CO_2$, $F_2$, and $H_2$ in appropriate sputtering systems can be used to obtain films having desired composition. Although film composition is selected in the above examples to optimize conductivity and transparency, other physical properties, for example, piezoelectric character, stress, strain, and crystal structure can be carefully controlled by controlling film composition using the method and apparatus of this invention.

What is claimed is:

1. Thin film deposition apparatus for reactively sputter depositing a film, the apparatus comprising a substrate, a target, means for directing sputtered target material towards the substrate, means for directing reactive gas at a present flow rate to the substrate, an apertured barrier containing a series of vertical slots intermediate the target and the substrate to limit passage of the reactive gas to the target and to control the rate at which target material reaches the substrate, whereby at said preset reactive gas flow rate to fix the composition of a film reactively deposited from the target material and the reactive gas;

and a mounting arrangement comprising a carousel having a control axis extending in the same direction as the longitudinal extent of said slots, said substrate being contained on said mounting arrangement whereby rotation of said mounting arrangement causes a deposition area of said substrate to move past said slots to ensure uniform deposition over said deposition area.

2. Apparatus as claimed in claim 1, in which said barrier is a box housing the target.

3. Thin film deposition apparatus for reactively sputter depositing a film, the apparatus comprising a substrate; a target; means for directing sputtered target material towards the substrate; means comprising a conduit extending around the deposition area to direct reactive gas at a preset flow rate to the substrate; an apertured barrier intermediate the target and the substrate to limit passage of the reactive gas to the target and to control the rate at which target material reaches the substrate; means for applying an inert atmosphere around the target; and means for applying a sputtering voltage to the target.

4. Apparatus as claimed in claim 3, in which the conduit is a tube having apertures positioned to direct the reactive gas at the substrate.

5. Apparatus as claimed in claim 1, further comprising means for applying r.f. power to the substrate during deposition of a film.

6. A method for reactively sputter depositing a film, the method comprising generating and directing sputtered target material towards a substrate, applying an inert atmosphere around the target, directing reactive gas at a preset flow rate to a deposition area of the substrate, and, using an apertured barrier intermediate the target and the substrate, limiting passage of reactive gas to the substrate and controlling the rate at which target material reaches the deposition area of the substrate whereby at said preset reactive gas flow rate to fix the composition of a film reactively deposited from the sputtered target material and the reactive gas.

7. A method as claimed in claim 6, in which r.f. energization is applied at said substrate to cause enhancement of gas reactivity.

8. A method as claimed in claim 6, in which said substrate is periodically moved in order to equalize deposition rate over the deposition area of the substrate.

9. A method as claimed in claim 6, in which the film is sputter deposited in a magnetron sputtering chamber.

10. A method as claimed in claim 6, in which the reactive gas is one of the group consisting of $O_2$, $H_2S$, $CO_2$, $N_2$, $F_2$ and $H_2$.

11. A method as claimed in claim 6, in which the target material is one of a group consisting of cadmium-tin, zinc, and indium-tin.

* * * * *